United States Patent [19]
Balakrishnan

[11] 4,388,699
[45] Jun. 14, 1983

[54] BUBBLE MEMORY SENSE AMPLIFIER

[75] Inventor: Ramanatha V. Balakrishnan, San Jose, Calif.

[73] Assignee: National Semiconductor Corporation, Santa Clara, Calif.

[21] Appl. No.: 225,876

[22] Filed: Jan. 19, 1981

[51] Int. Cl.³ ............................................. G11C 19/08
[52] U.S. Cl. ....................................................... 365/8
[58] Field of Search ...................... 365/8, 158; 329/200

[56] References Cited

U.S. PATENT DOCUMENTS 3,958,185  5/1976  Hartung ..................................... 365/8
4,174,539  11/1979  Timm ........................................ 365/8

FOREIGN PATENT DOCUMENTS 55-129910  10/1980  Japan ..................................... 365/158

Primary Examiner—James W. Moffitt
Attorney, Agent, or Firm—Gail W. Woodward; Paul J. Winters; Neil B. Schulte

[57] ABSTRACT

A bubble sense amplifier has a biasing circuit for adjusting the bias currents through magneto-resistive detectors so as to establish a preferred common mode operating voltage across the bubble detectors. The preamplifier is coupled through a junction capacitance circuit to a clamp-and-strobe circuit and to a differential comparator. The differential comparator has a selectable threshold voltage, and compares the differential bubble signal to the selected threshold voltage.

5 Claims, 8 Drawing Figures

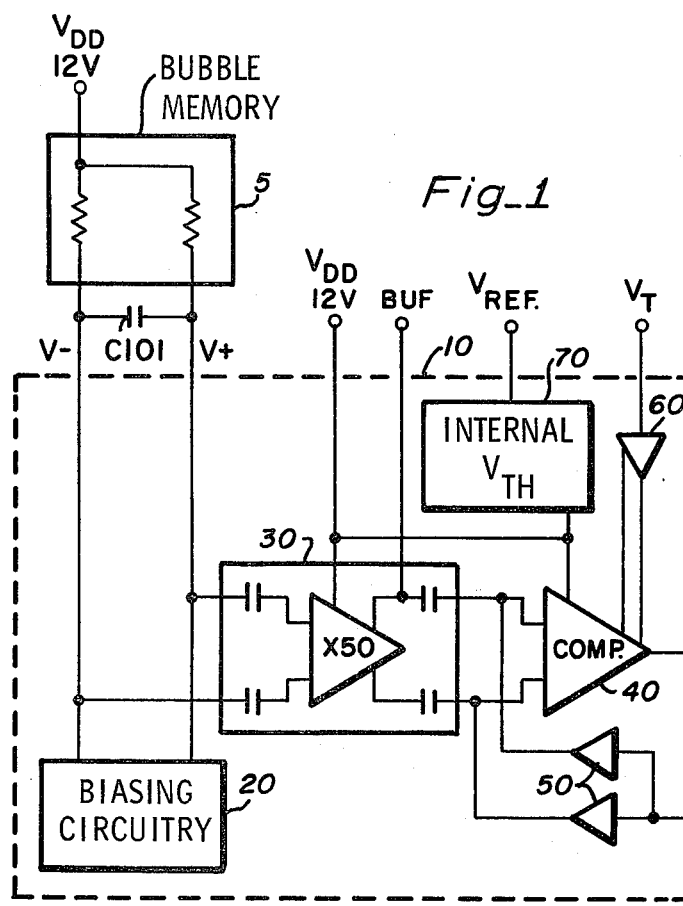
Fig_1
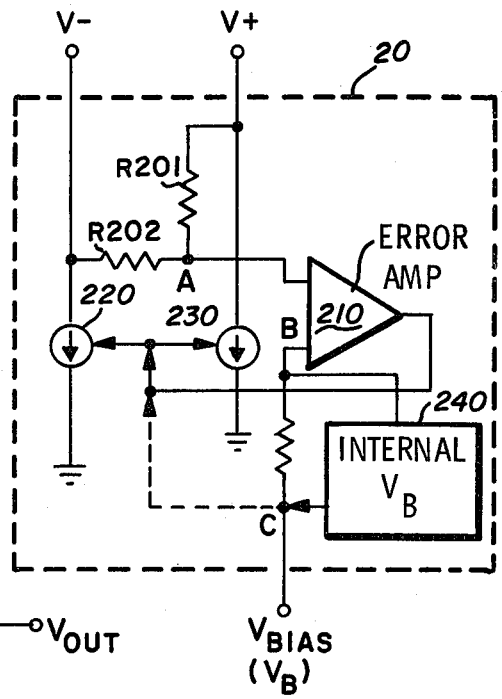
Fig_2
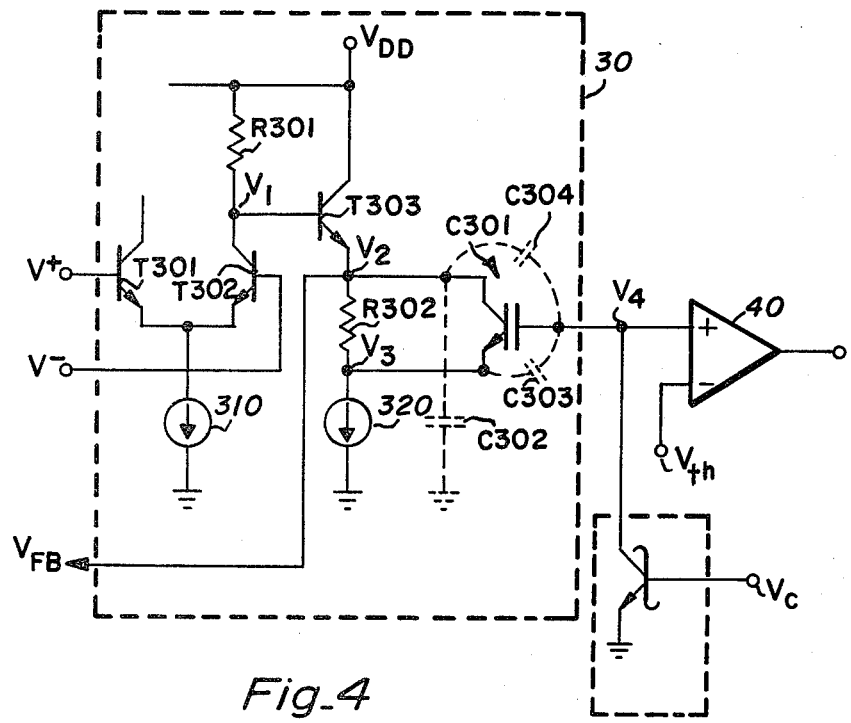
Fig_4
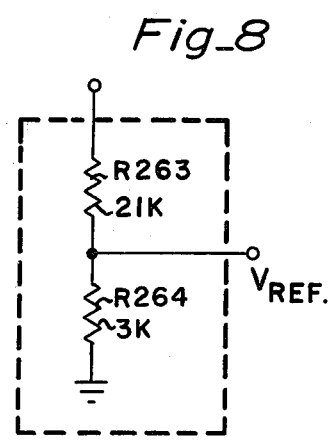
Fig_8

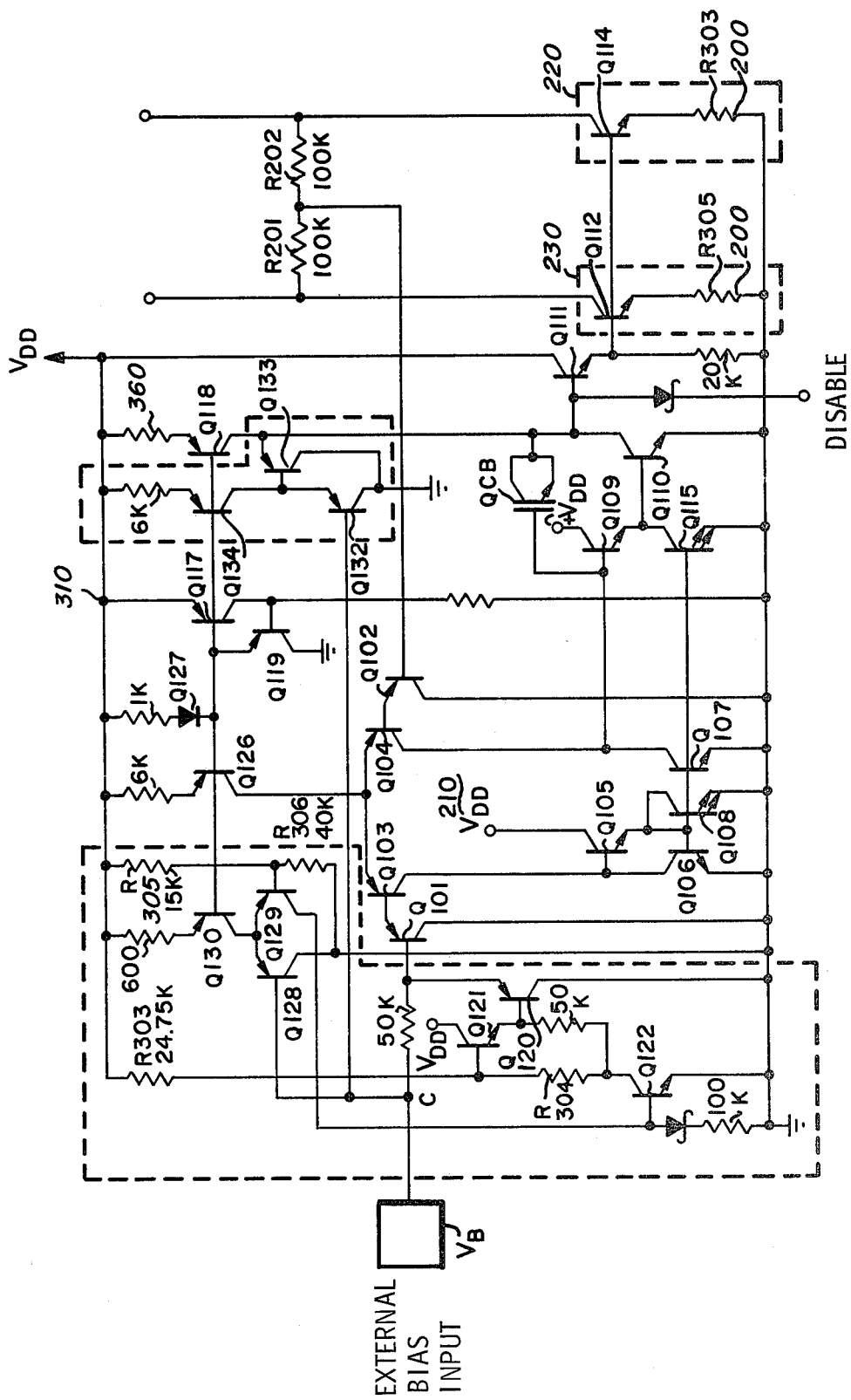
Fig_3

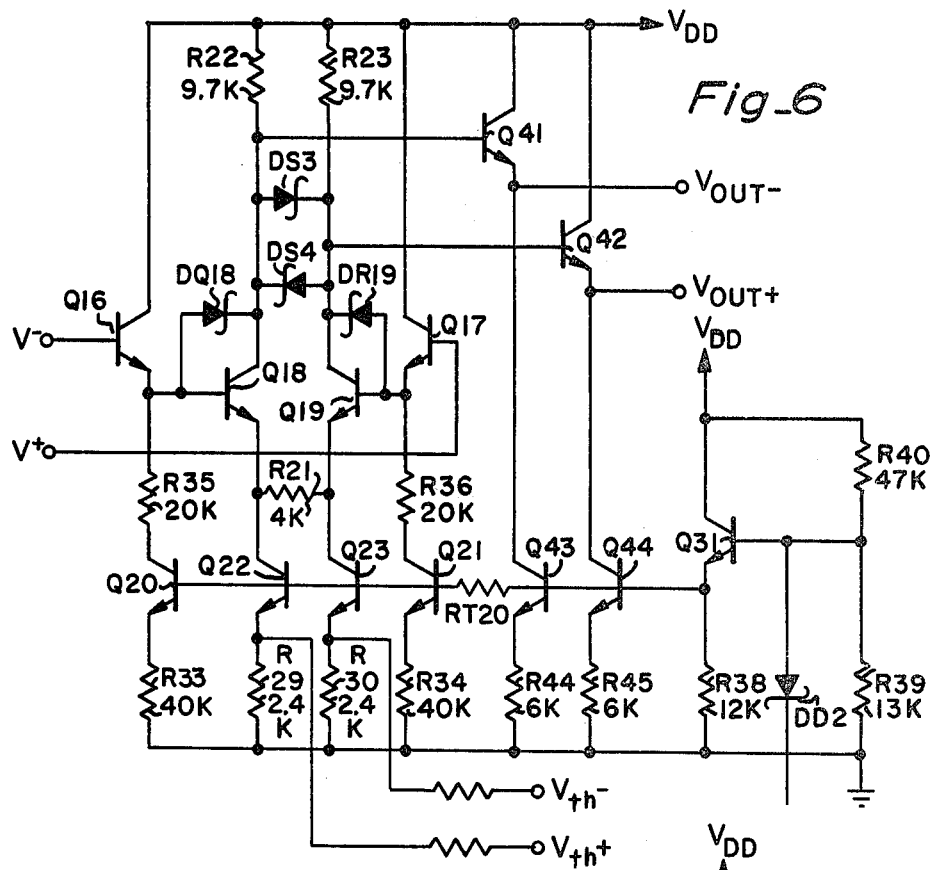
Fig_6
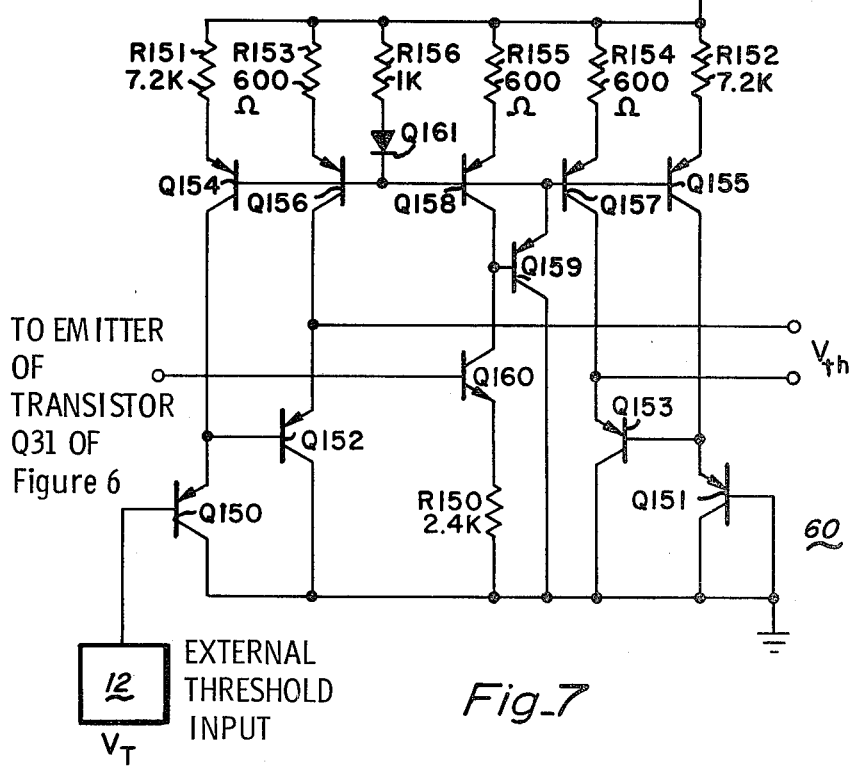
Fig_7

BUBBLE MEMORY SENSE AMPLIFIER

BACKGROUND OF THE INVENTION

1. Field of the Invention

The present invention relates to the use of a clamp-and-strobe differential amplifier circuit in a bubble memory sense amplifier. Specifically, the present invention relates to a constant voltage biasing circuit, an AC coupling circuit and a differential comparator for detecting changes in resistance of bubble memory magneto-resistive detectors.

2. Description of the Prior Art

Conventional clamp-and-strobe bubble memory sense amplifier circuits have biasing circuits for establishing a current through the bubble memory detectors and have capacitors for a capacitively coupling a preamplifier to a comparator and clamp circuit. However, these circuits typically have fixed current biasing circuits which results in a wide variation in the d.c. operating voltage applied to the bubble memory detectors. Since the amplitude of the bubble signal is a function of the voltage across the detectors, it is desirable to have a constant d.c. operating voltage independent of the resistance of the detector to produce the same signal amplitude from any bubble memory.

Typically, bubble memory sense preamplifiers use a clamp and strobe technique to eliminate low frequency clock noise. Characteristically, this low frequency clock noise is quite large in comparison to the voltage variation caused by the bubble signal. The clamp and strobe technique clamps the output voltage of the preamplifier to ground until the anticipated bubble signal occurs. The output is then allowed to float and capacitively coupled to the comparator. This results in a DC bias being stored on the capacitors which cancels the DC noise at the time the clamp signal is released and allows the voltage variation of the small bubble signal to be sensed. However, this technique requires a capacitive coupling between the amplifier and the comparator and a clamp circuit coupled between the capacitive coupling and the comparator, which places an undesirable capacitive load on the amplifier output and is difficult to implement in an integrated circuit.

Bubble memories typically are characterized by bubble signals having a frequency between 500 kHz-2 mHz. A wide band preamplifier is desired in order to be compatible with the wide range of bubble memory types. The coupling capacitor between the preamplifier and the comparator needs to be around 100 pF to provide this $-0.1$ db band width. In addition, the amplifier must be stable when the capacitors are clamped to ground by the clamp circuit. Unfortunately, capacitors in the 100 pF range are typically quite large when implemented on semiconductor circuits. Further, it is difficult to compensate AC coupled wide-band amplifiers for large capacitive loads on their output. Specifically, large capacitors on semiconductor circuits typically are constructed from metal-oxide-$N^{30}$ capacitors known as "Metal Capacitors." These metal capacitors are characterized by their large size, typically 1500 sq. mils for a 100 pF capacitor, and by a large parasitic capacitance coupled to ground. Typically, this parasitic capacitance is of approximately the same order of magnitude as the coupling capacitance. When such metal capacitors are used in the present circuit they result in a 100 pF parasitic capacitance between the output of the preamplifier circuit and ground. Such a capacitive loading at the output causes a lag in the output signal. Since most preamplifier circuits utilize feedback, this lag may result in an instability at high frequencies. To compensate for this instability, the high frequency gain must be reduced by increasing the size of a compensation capacitor. However, this reduces the bandwidth of the preamplifier. It is undesirable to reduce the bandwidth of the preamplifier or to use a large compensation capacitor which takes up an undesireably large amount of space on a semiconductor. Secondly, it is desirable to lower the capacitive loading on the output of the preamplifier circuit and to use physically smaller coupling capacitor while simltaneously maintaining the capacitive coupling between the preamplifier and the comparator at the 100pF level. By lowering the capacitor loading on the preamplifier, assuming that the coupling capacitance can be left at the same value, a higher-band width can be attained, and by making the capacitor physically smaller, valuable area on the semiconductor die can be saved. In addition, it is desirable to have a differential output from the preamplifier but this makes it difficult to compare the output signal to a threshold voltage. Accordingly, it is desirable to provide constant d.c. voltage biasing circuit, an improved coupling circuit characterized by a smaller loading on the preamplifier output, and a differential comparator adapted to compare a differential signal with a threshold voltage.

BRIEF DESCRIPTION OF THE FIGURES

FIG. 1 is a block diagram of a bubble sense amplifier in accordance with the preferred embodiment of the present invention.

FIG. 2 is a block diagram of the biasing circuitry of FIG. 1.

FIG. 3 is a detailed schematic diagram of the biasing circuitry of FIGS. 1 and 2.

FIG. 4 is a simplified schematic diagram of the output stage of the preamplifier of FIG. 1.

FIG. 6 is a detailed schematic diagram of the differential comparator of FIG. 1.

FIG. 7 is a detailed schematic diagram of the $V_{th}$ buffer circuit 60 of FIG. 1.

FIG. 8 is a detailed schematic diagram of the internal $V_{th}$ circuit of FIG. 1.

SUMMARY OF THE INVENTION

Figure 5:
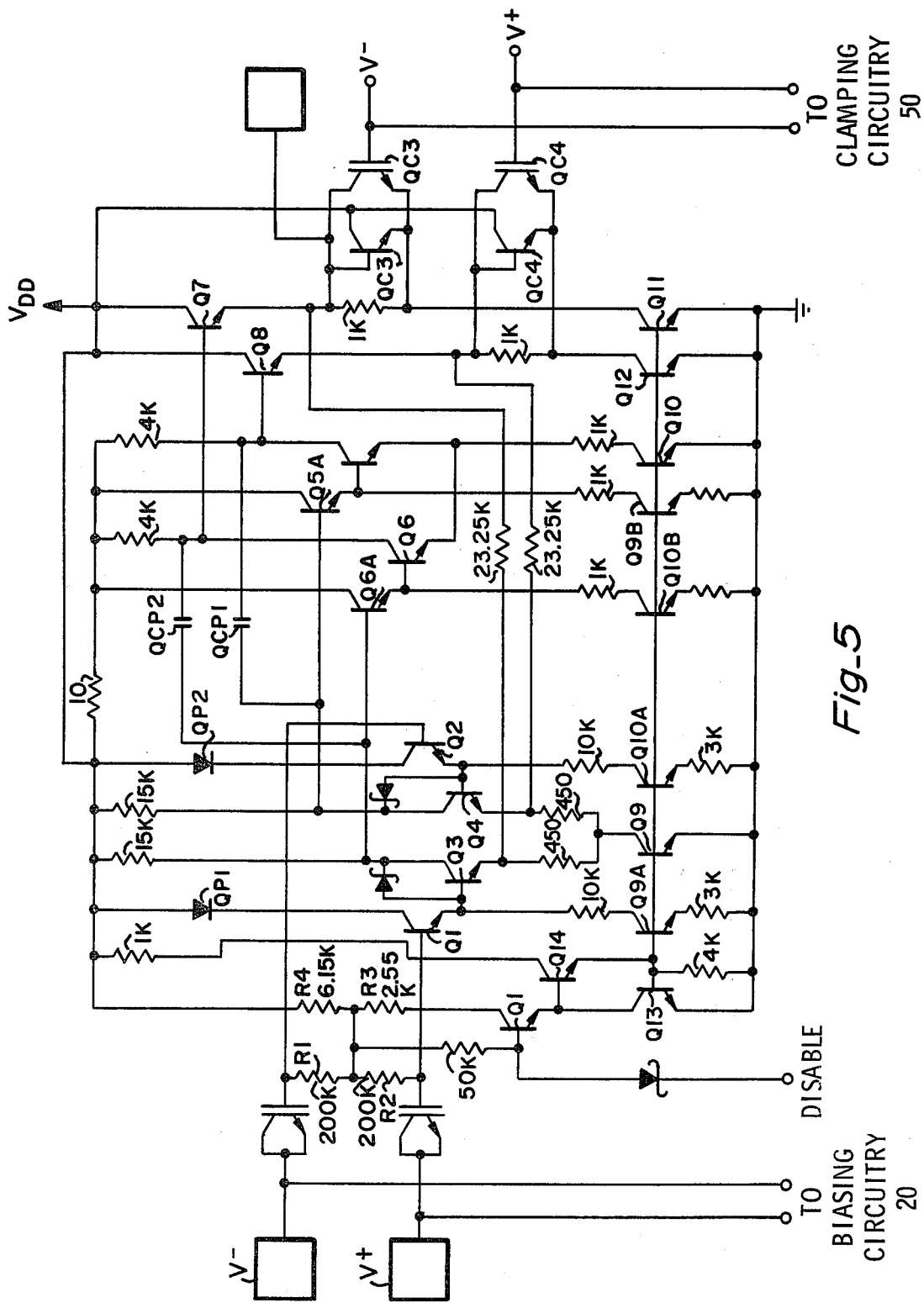
FIG. 5 is a detailed schematic diagram of the preamplifier of FIG. 1.

The preferred embodiement of the present invention is a clamp-and-strobe bubble sense amplifier circuit having a biasing circuit, a preamplifir, an AC coupling circuit, a differential comparator and a clamp-and-strobe circuit. The biasing circuit is coupled to the input terminals for providing a current to the inputs which is self-adjusted to maintain the common mode d.c. voltage applied to the detectors at a preferred amplitude. The preamplifier provides a differential output which is capacitively coupled to the differential comparator circuit and a clamp-and-strobe circuit via a coupling circuit using the junction capacitances of a bipolar transistor. The differential comparator circuit is a differential amplifier having a temperature compensated offset circuit for comparing the differential output from the preamplifier to a threshold voltage, and for providing an output in response to a bubble signal from the preamplifier.

DETAILED DESCRIPTION OF THE PREFERRED EMBODIMENT

FIG. 1 is a block diagram of a bubble memory 5 and a bubble sense amplifier 10 in accordance with the preferred embodiment of the present invention. Bubble memories are characterized by magneto-resistive bubble detectors which vary in resistance in response to the presence of the magnetic field associated with a magnetic bubble. These detectors are usually operated as a differential pair with a reference detector isolated from the fields of the magnetic bubbles and an active detector for sensing bubble fields. Typically, these detectors have a resistance of 1–2K ohms and vary approximately ¼%, corresponding to about a 3–7 mV signal, in response to the presence of a magnetic bubble. Unfortunately, the common mode noise of the output signal, largely due to the rotating magnetic field associated with bubble memories, is approximately 150 mV and the differential mode noise is approximately 20 mV. This low signal-to-noise ratio makes bubble detection difficult.

A capacitor C101 is coupled accross the terminals V− and V+ to reduce high frequency noise and typically has a value of approximately 100 pf. Fortunately, most of the remaining noise is periodic, resulting from the rotating magnetic field of the bubble memory. By using a clamp-and-strobe technique, which samples the input signal in a narrow time window associated with the bubble signal, the effects of the periodic noise can be largely eliminated.

Biasing circuitry 20 draws a current of approximately 5 mA through each detector and establishes the d.c. operating point for the bubble detectors. These inputs are capacitively coupled to preamplifier 30, amplified, and capacitively coupled to a comparator 40. The inputs to comparator 40 are also coupled to clamp a strobe circuit 50.

In operation, the comparator inputs are clamped to ground causing a dc bias to be stored on the coupling capacitors between preamplifier 30 and comparator 40. When the clamp signal is released, the ac signal associated with the bubble signal is coupled to comparator 40, compared to a threshold voltage level $V_{th}$ and a signal responsive to the presence of a magnetic bubble signal is provided on terminal $V_{out}$.

FIG. 2 is a block diagram of biasing circuitry 20 of FIG. 1. The V+ and V− terminals are coupled to resistors R201 and R202 respectively for providing the average common mode operating voltage of the two input signals at node A. Node A is coupled to one input of error amplifier 210. Another input node B of error amplifier 210 is coupled to receive a bias signal $V_B$ which may be supplied by either an internal bias generator 240 or an external input node C. The output of error amplifier 210 is coupled to control inputs of current sources 220 and 230. Thus, the error signal controls the current supplies 220 and 230 and the resulting current drawn thru the detector resistances of bubble memory 10. This feedback causes the biasng circuitry to be self-adjusting to establish a preferred common mode operating voltage output at node A. This allows for optimization of the design of the preamplifier sense circuit for a variety of bubble memory detectors by creating a uniform interface for bubble memories having different detector resistances. It also results in a uniform a.c. bubble signal amplitude.

FIG. 3 is a detailed schematic diagram of the biasing circuitry of FIG. 2. The biasing circuitry has three modes of operation. In the first mode of operation the external bias input $V_B$ is tied to the 12 volt $V_{DD}$ voltage supply. Node D at the base of transistor Q129 is set to 9 volts by the voltage divider action of resistors R305 and R306. When $V_B$ is greater than nine volts, transistor Q129 turns on, the voltage at the base of transistor Q122 goes to a high voltage level turning transistor Q122 on, and transistor Q122 draws current through resistors R303 and R304 which are selected to set node E at a voltage of 7 volts. This voltage turns on transistors Q121 and Q120, setting the voltage at node B to the voltage at node E, that is, seven volts. Error amplifier 210 then sets the currents drawn by current sources 220 and 230 such that node A between resistances R201 and R202 is at seven volts which establishes the desired common mode operating voltage of the preamplifier. This operating condition is referred to as the "internal constant voltage mode," since by setting the positive input of error amplifier 210 (node B) to seven volts, the common mode operating voltage at node D is set to the preferred value of 7 volts.

In a second mode of operation, with $V_B$ less than eight volts but greater than 4 volts, the common mode operating voltage is a direct function of the voltage applied to the external bias input $V_B$. When $V_B$ is less than the voltage on node D (nine volts), transistor Q129 is off, transistor Q122 is off, transistor Q120 is off, and the input B is allowed to float. Thus, the voltage on node B is equal to the voltage of the external bias input $V_B$ on node C. The common mode operating voltage at node A then follows the voltage applied to the input $V_B$ on node C. This mode of operation is referred to as the "direct voltage control mode".

In a third mode of operation the $V_B$ voltage applied the external bias input directly controls the value of the currents provided by current sources 220 and 230. Specifically, the currents I1 and I2 are both directly proportional to the voltage $V_B$ in this mode of operation. In the other modes of operation, the voltage at node F is typically equal to the voltage drop across resistor R301 (1 volt) plus 2 $V_{BE}$). Since the voltage at the base of Q132 ($V_B$) is larger than the voltage at node F, transistor Q132 is off and current control circuitry 310 is inactive. However, if the bias voltage $V_B$ is less than two volts, the current control circuitry 310 is activated, directly controls the voltage applied to the base of transistor Q111 and current sources 220 and 230 and effectively deactivates error amplifier 210. The voltage rise from node C to node F across transistors Q132 and 132 is matched by the voltage drop from node F across transistor Q111 and Q112, thus the currents I1 and I2 are directly proportional to the amplitude of the bias voltage $V_B$ and the values of resistors R301 and R302.

The exact voltage at which control circuitry 310 is activated varies somewhat depending on the resistance of the detectors in the bubble memory and the currents being drawn through resistors R301 and R302. However, in general, the control circuitry 310 is not active above a voltage greater than four volts.

Thus, the preferred embodiment of the present invention not only provides a constant voltage mode of operation, but also provides two other selectable modes of operation, the operating mode being selected in response to the voltage range of a signal applied to a common input.

FIG. 4 is a simplified schematic diagram of the output stage of preamplifier circuit 30 of FIG. 1. A differential signal responsive to the bubble signal is applied to input terminals V+ and V−. This differential signal is applied to the inputs of a differential amplifier constructed from transistors T301 and T302, current supply 310 and resistor R301. The differential amplifier provides a ground reference output signal $V_1$ in response to the differential input and applies the output signal to the base of transistors T303. The source of transistor T303 is coupled to a power supply $V_{DD}$ and the emitter is coupled to a first terminal of resistor R302. Node $V_2$ is coupled to a feed-back circuit of the preamplifier. The second terminal of resistor R302 is coupled to a current supply 320 as illustrated in the diagram, and is characterized by a voltage $V_3$. The junction capacitances of bipolar transistor C301 are used for coupling preamplifier 30 to differential comparator 40. Specifically, the collector of transistor C301 is coupled to the emitter of transistor T303 and the emitter of transistor C301 is coupled to the second terminal of resistor R302. The base of transistor C301 provides preamplifier output voltage $V_4$ and is coupled to the positive terminal of comparator 40. The base of transistor C301 is also coupled to clamp circuit 50. Finally, the other input of differential comparator 40 is coupled to receive a threshold voltage $V_{TH}$.

Transistor C301 used for the capacitive coupling of the preamplifier to the differential comparator takes up approximately one tenth the area on the semiconductor die required by a metal capacitor, thus a great saving in area results. Typically, the collector to base capacitance of transistor C301 is approximately 15% of the total coupling capacitance C between the preamplifier and the comparator. The emitter to base capacitance is approximately 85% of the total coupling capacitance. A small parasitic capacitance C302 is associated with the source and can be characterized by a capacitance coupled between the source and the ground having a value of approximately 10% of the total coupling capacitance. This parasitic capacitance is illustrated in dashed lines.

Resistor R302 buffers the larger collector-to-base capacitance C303 at high frequency under clamped output conditions. This reduces the loading of the preamplifier and makes it easier to compensate. Further, voltage $V_3$ lags behind voltage $V_2$ as a result of the larger coupling capacitance. However, at higher frequencies the smaller capacitance through C304 is sufficient to couple the preamplifier output to comparator 40. At lower frequencies where the larger capacitance C303 is needed to increase the capacitive coupling, the lag of voltage $V_3$ is small. Thus, this output circuit has a low and a high frequency path which results in an increased band width and a lower amount of required compensation.

The parasitic capacitance to ground appears on the low impedance output node and has a very small parasitic amplitude which further reduces the amplitude loading and improves amplifier stability. The primary output node $V_3$ does not have only parasitic capacitances coupled to ground. Thus, the present preamplifier is easily coupled and characterized by a minimum capacitive loading for the capacitive coupling that it provides.

The present circuit has been adapted to maximize the dynamic range available. Specifically, the emitter to base junction of transistor C301, which is conventional bipolar transistor, typically breaks down at a voltage of approximately six volts. Specifically, if the emitter of transistor is more than six volts greater than the voltage applied to its base, the emitter-base junction will break down. The resistor R302 causes a voltage drop which reduces the emitter voltage and reduces the risk of this break down. The value of resistor R302 is approximately 1 kohm and the current drawn by current source 320 is approximately 1 milli amp, thus the d.c. voltage drop across resistor R302 is preferably 1 volt.

FIG. 5 is a detailed schematic diagram of the preamplifier of FIGS. 1 and 4. When clamped, the relatively large RC time constant of the mode associated with voltage $V_3$ causes voltage $V_3$ to lag behind voltage $V_2$. When the clamping signal is released and voltage $V_4$ allowed to float, the capacitive load associated with $V_3$ is substantially reduced and $V_3$ suddenly becomes in phase with $V_2$ causing an undesirable transient in the output voltage $V_4$. To reduce this transient, transistors QC3X and QC4X has its base coupled to the collector of transistor QC3 and its emitter coupled to the emitter of the same transistor. This eliminates the AC lag between voltage $V_2$ and $V_3$ by reducing the impedance at node $V_3$. The addition of these transistors reduces the d.c. voltage drop across resistor R302 to approximately 0.75 volts.

FIG. 6 is a detailed schematic diagram of comparator 40 of FIG. 1. Comparator 40 has inputs V− and v+ coupled to the corresponding outputs of preamplifier 30 (FIG. 5) to receive the differential bubble signal. Comparator 40 is also coupled to receive a differential threshold voltage signal on inputs $V_{th}^+$ and $V_{th}^-$ to offset the input differential stage by a selectable amount to establish a threshold voltage for the comparator. Specifically, buffer circuit (FIG. 7) converts an adjustable 0-5 volt ground referenced threshold voltage input to a 0-10 mV differential signal which is applied to nodes $V_{th}^+$ and $V_{th}^-$. This differential signal results in a difference between the currents drawn by transistors Q22 and Q23. This differential current flows through resistor R21, which establishes a voltage offset between the emitters of the differential transistor pair Q18 and Q19, thus establishing a threshold voltage for comparator 40.

The differential output of comparator 40 is provided at nodes $V_{out}^-$, and $V_{out}^+$. Since different currents are drawn through transistors Q22 and Q23, the transconductances of the devices are different. Specifically, the transconductances vary inversely with temperature and this difference in transconductance between the devices would result in a variation in the threshold voltage of the differential comparator with temperature unless it is compensated for. The transconductance of a transistor varies in proportion with the collector current through the device, and the current through transistors Q22 and Q23 is proportional to $V_1$. Thus, by causing $V_1$ to vary linearly with absolute temperature, the effects of temperature on the transconductances of transistors Q22 and Q23 is cancelled, and the differential comparator threshold voltage is stable over temperature. The voltage $V_1$ at the emitters of transistors Q22 and Q23 is set equal to approximately 1.2 volts ($V_2-2 V_{BE}$) by applying a voltage of 2.6 volts to the base of transistor Q31. Preferably, this voltage is with 5% of 2.6 volts. Further, $V_B$ decreases approximately 2 mV/°K. Accordingly, $V_1 = 1.2 + 4mV/(T(°K) - 300)$ $V_1 = 4mV/T(°K)$ and the collector current is inversely proportional to temperature as desired.

FIG. 7 is a detailed schematic diagram of $V_{th}$ buffer circuit 60. $V_{th}$ buffer circuit 60 converts an externally applied ground reference threshold voltage to a differential signal which is applied to differential comparator 40. Alternatively, the ground reference voltage can be obtained from an internal $V_{th}$ circuit 70 illustrated in FIG. 8. One advantage of using the internally generated $V_{th}$ is that it can be made to track proportionately with the supply voltage $V_{DD}$. The common mode operating voltage across the bubble detectors is also proportional to $V_{DD}$. Thus, variations in the bubble signal amplitudes due to fluctuations in the supply voltage will be exactly compensated for by variations in the threshold voltage.

While the invention has been particularly taught and described with reference to the preferred embodiments, those versed in the art will appreciate that minor modifications in form and detail may be made without departing from the spirit and scope of the invention. Accordingly, all such modifications are embodied within the scope of this patent as properly come within my contribution to the art and are particularly pointed out by the following claims.

I claim:

1. A circuit for biasing differential first and second inputs comprising:
current source means coupled to the first and second magneto-resistive detectors and having a control input for providing one current to the first magneto-resistive detector having an amplitude responsive to the amplitude of a signal applied to the control input and for providing another current to the second magneto-resistive detector having an amplitude substantially identical to the one current;
a first resistor having a first terminal coupled to the first magneto-resistive detector and having a second terminal;
a second resistor having a first terminal coupled to the second magneto-resistive detector and having a second terminal coupled to the second terminal of the first resistor; and
a differential amplifier having first input coupled to the second terminals of the first and second resistors, a second input, and an output coupled to the control input of the current source means for providing a signal to the control input having an amplitude responsive to the difference between the amplitudes of the signals applied to the first and second inputs of the differential amplifier.

2. A circuit as in claim 1 further comprising: a third resistor having a first terminal coupled to the second input of the differential amplifier and having a second terminal; and voltage means coupled to the first and second terminals of the third resistor for applying a preselected voltage to the first terminal in response to the voltage applied to the second terminal having a voltage in a first preselected voltage range.

3. A circuit as in claim 1 or 2 further comprising current control means having an input coupled to the second input of the differential amplifier and an output coupled to the control input for providing a signal to the control input responsive to the amplitude of the signal applied to the second input of the differential amplifier in response to the signal applied to the second input of the differential amplifier having an amplitude in a predefined voltage range.

4. A circuit as in claim 2 further comprising current control means having an input coupled to the second input of the differential amplifier and an output coupled to the control input for providing a signal to the control input responsive to the amplitude of the signal applied to the second input of the differential amplifier in response to the signal applied to the second input of the differential amplifier having an amplitude in a second preselected voltage range.

5. A circuit as in claim 4 wherein the first preselected voltage range comprises voltages having amplitudes greater than a first voltage, the second preselected voltage range comprises voltages having amplitudes less than a second voltage, and the first voltage has an amplitude greater than the second voltage.

* * * * *